US009831855B1

(12) United States Patent
Bogi et al.

(10) Patent No.: US 9,831,855 B1
(45) Date of Patent: Nov. 28, 2017

(54) GENERAL PURPOSE RECEIVER

(71) Applicant: ARM Limited, Cambridge (GB)

(72) Inventors: Seshagiri Rao Bogi, Bangalore (IN);
Vijaya Kumar Vinukonda, Bangalore (IN); Mikael Rien, Bernin (FR)

(73) Assignee: ARM Limited, Cambridge (GB)

(*) Notice: Subject to any disclaimer, the term of this patent is extended or adjusted under 35 U.S.C. 154(b) by 0 days.

(21) Appl. No.: 15/155,003

(22) Filed: May 14, 2016

(51) Int. Cl.
  *H03K 5/06* (2006.01)
  *H03K 3/3565* (2006.01)
  *H03K 19/00* (2006.01)
(52) U.S. Cl.
  CPC ............ *H03K 5/06* (2013.01); *H03K 3/3565* (2013.01); *H03K 19/0013* (2013.01)
(58) Field of Classification Search
  CPC .. H03K 5/01; H03K 5/04; H03K 5/06; H03K 5/131; H03K 5/133; H03K 5/135; H03K 17/163; H03K 17/167; H03K 17/689; H03K 17/168

USPC ......................................... 327/170, 172, 175
See application file for complete search history.

(56) References Cited

U.S. PATENT DOCUMENTS 5,920,210 A * 7/1999 Kaplinsky ............ H03K 3/3565
                                                        326/21
6,583,644 B2 * 6/2003 Shin .................. H03K 19/00384
                                                        326/26

* cited by examiner

*Primary Examiner* — John Poos
(74) *Attorney, Agent, or Firm* — Pramudji Law Group PLLC; Ari Pramudji

(57) ABSTRACT

Various implementations described herein are directed to circuit. The circuit may include a first input stage having first devices and a first path for slow slew input detection. The circuit may include a second input stage having second devices and a second path for fast slew input detection. The circuit may include a separation stage that couples the second input stage to the first input stage during a first mode of operation so as to reduce power consumption of the circuit during slow slew input detection.

18 Claims, 5 Drawing Sheets

GENERAL PURPOSE RECEIVER

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

Integrated circuits may be configured with general purpose input/output (GPIO) pins to provide chip designers with access to available digital control lines. Even though GPIO pins may not have a predefined purpose, these unused GPIO pins are available by default. Thus, chip designers building a system on a chip (SoC) may use these available GPIO pins as digital control lines so as to avoid having to arrange additional circuitry on a chip to provide for digital control lines.

FIG. 1 shows a diagram of a conventional GPIO receiver circuitry 100. The conventional GPIO receiver circuitry 100 uses input stages PAD, PADB that are common for Schmitt mode (slow slew) as well as CMOS mode (fast slew). Unfortunately, this GPIO receiver circuitry 100 is deficient and lacks performance due to power being wasted during Schmitt mode (slow slew). As shown in FIG. 1, when PAD is rising from 0V to DVDD, and when PAD is at Vih, transistors N1, N2 turn ON completely, and PADB becomes 0V (or DVSS, near ground voltage GND). At this time, transistor P3 is turned on, and when PAD input reaches from Vih to DVDD, there is a current path from DVDD to DVSS through transistors P1 and P3.

Similarly, when PAD is coming back from DVDD to 0V, and when PAD is at Vil, switching happens, and PADB becomes DVDD. At this time, transistor N3 turns ON, so from PAD reaching Vil to 0V, there is a current path from DVDD to DVSS through the transistors N3 and N1. These two current paths (or current deviations) are configured to generate or create hysteresis by delaying the threshold when PAD input rises or falls, from DVDD to DVSS. In some cases, similar problems may arise when PAD input is at Vih/Vil level or even when input and receiver supply are at upper and lower boundaries of IO (input/output) supply (DVDD), respectively.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein refer to and are directed to general purpose input output (GPIO) circuitry having circuit components arranged to reduce power consumption. For instance, implementations described herein refer to a GPIO receiver having a low frequency input detection stage that is separated from a high frequency input detection stage so as to reduce power dissipation of the GPIO receiver. In another instance, other implementations described herein refer to a Schmitt based GPIO receiver having a level detection circuit, such as, e.g., a Schmitt detection circuit, separated from another level detection circuit, such as, e.g., a complementary metal-oxide-semiconductor (CMOS) detection circuit so as to reduce power dissipation of the GPIO receiver.

Various implementations of GPIO circuitry having reduced power consumption will now be described in greater detail herein with reference to FIGS. 2-5.

Figure 1:
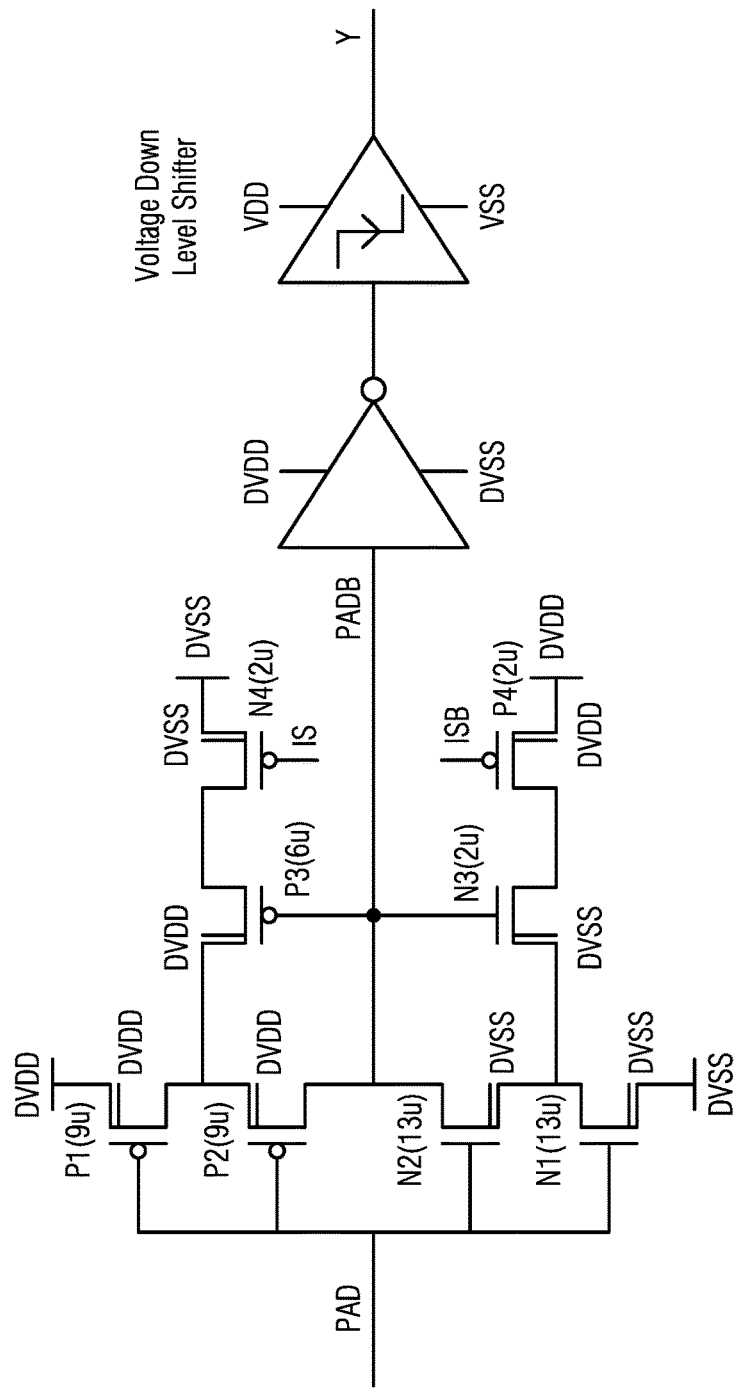
FIG. 1 illustrates conventional GPIO receiver circuitry as known in the art.
Figure 2:
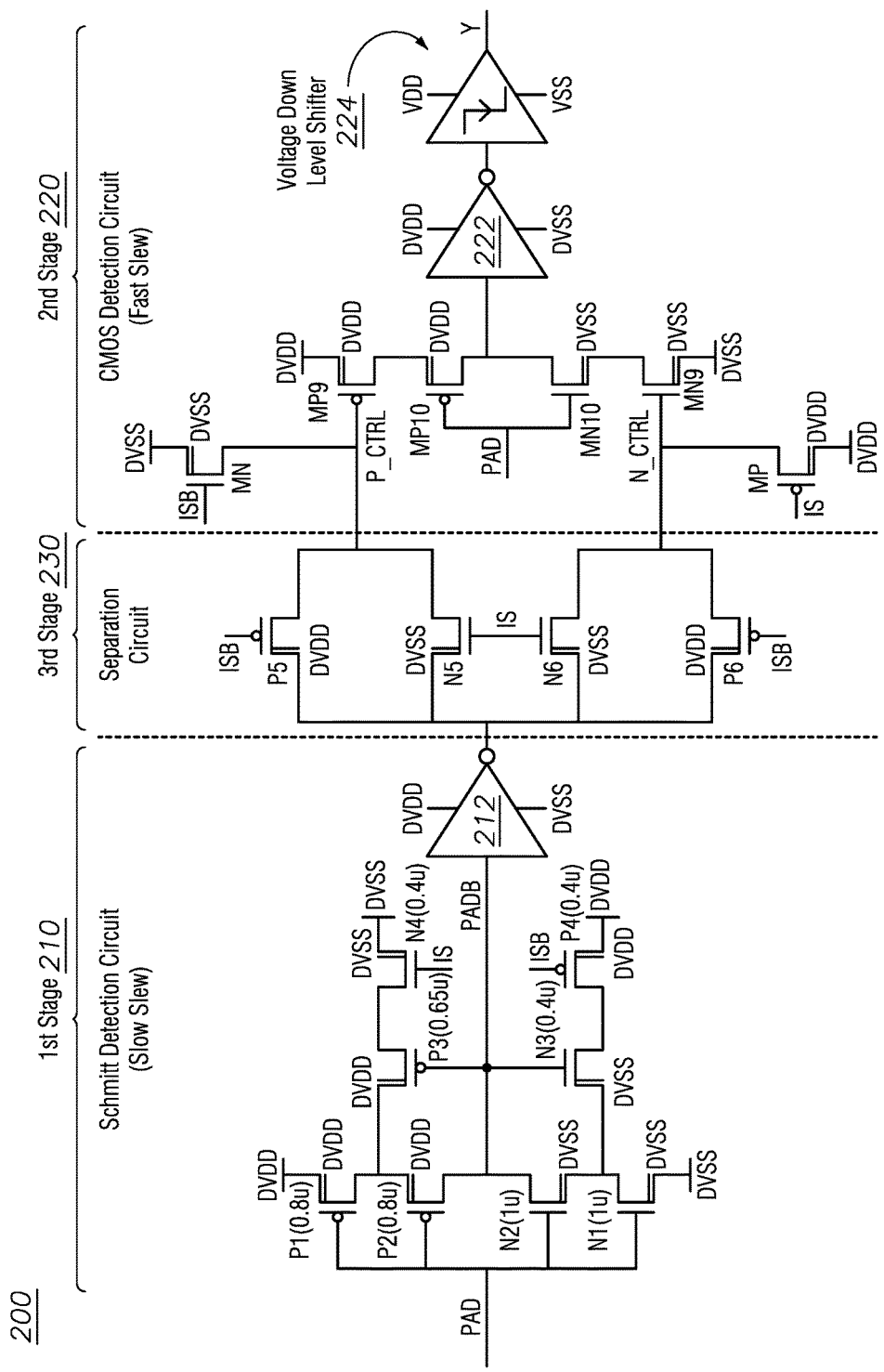
FIG. 2-4 illustrate various diagrams of GPIO receiver circuitry in accordance with various implementations described herein.
Figure 3:
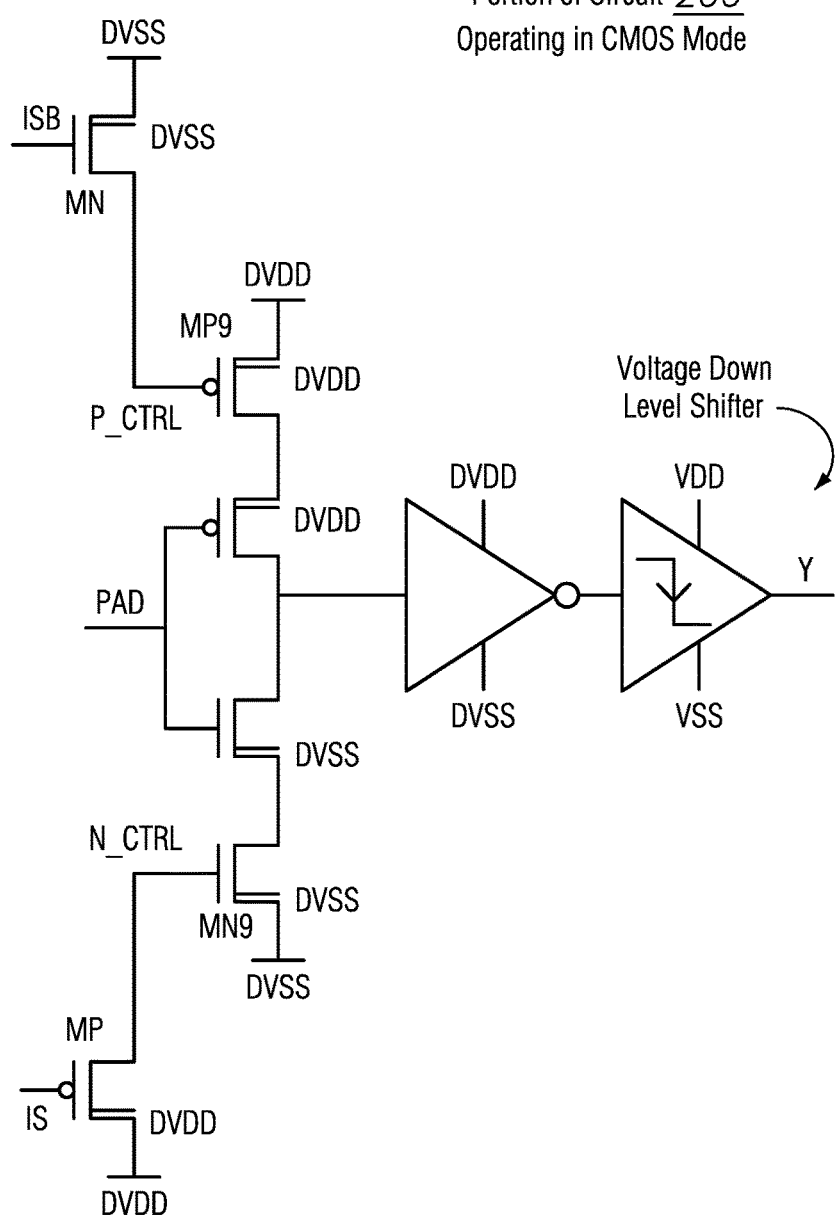
Figure 4:
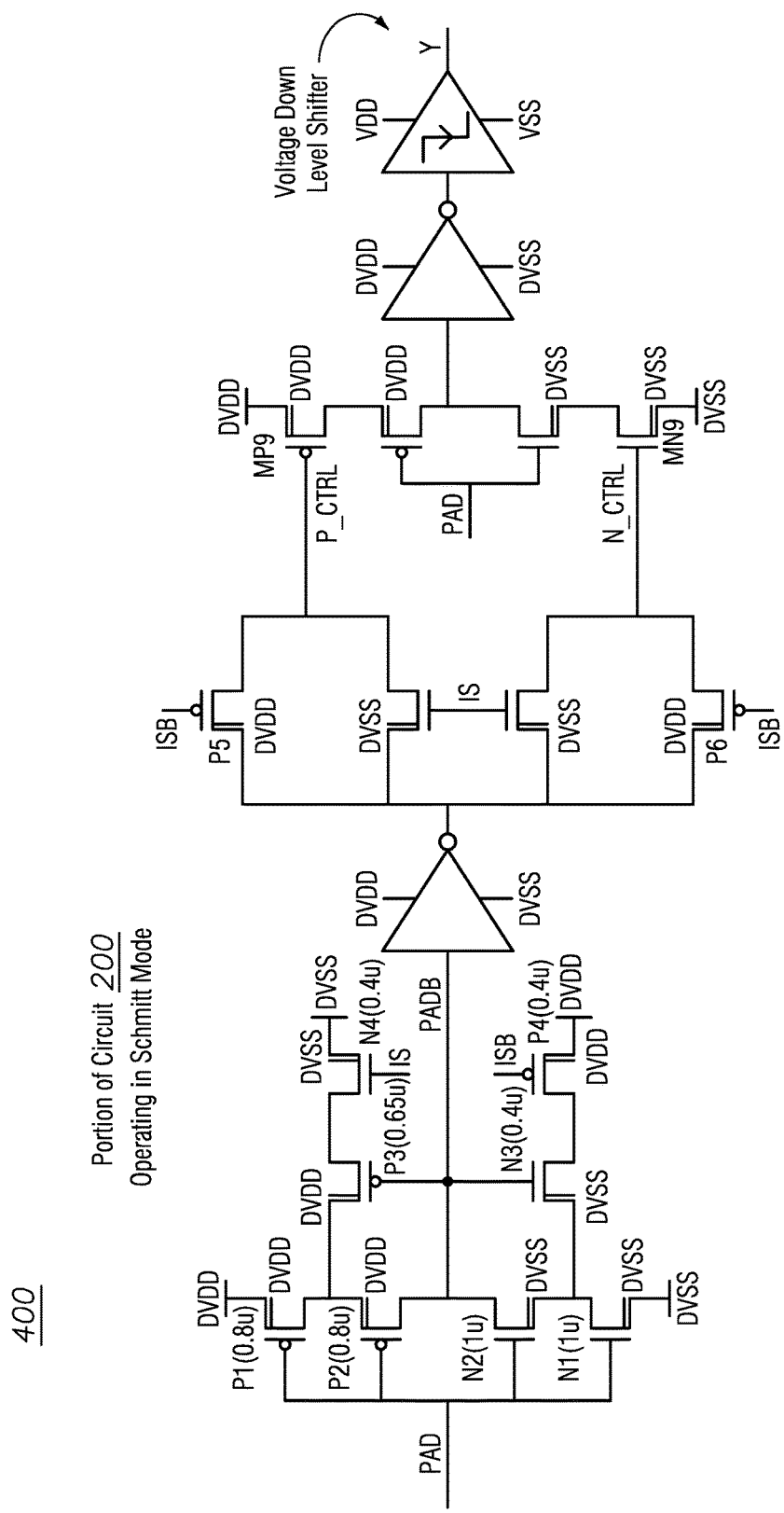

FIGS. 2-4 illustrate various schematic diagrams of GPIO receiver circuitry in accordance with implementations described herein. In particular, FIG. 2 illustrates a schematic diagram of a GPIO receiver circuit 200 having multiple stages including an isolation stage, FIG. 3 illustrates a schematic diagram of a portion of the GPIO receiver circuit 200 operating in a Schmitt mode, and FIG. 4 illustrates a schematic diagram of another portion of the GPIO receiver circuit 200 operating in a CMOS mode. In various implementations, the circuit 200 may be referred to as a receiver, a receiver circuit, and/or a GPIO receiver circuit or circuitry. Further, in some implementations, the circuit 200 may be referred to as a Schmitt based GPIO receiver.

In reference to FIG. 2, the GPIO receiver circuit 200 may include a first input stage 210 having first devices and a long path for slow slew input detection. In some cases, the first input stage 210 may be referred to as a low frequency input detection stage that is configured to support low frequencies, such as, e.g., ~1 MHz. In some cases, the first input stage 210 may be referred to as a Schmitt detection stage for low frequency applications, such as, e.g., within a range of 0.05-25 MHz.

The first devices may include first transistor devices, such as, e.g., one or more p-type MOS (PMOS) transistors P1, P2, P3, P4 and one or more n-type MOS (NMOS) transistors N1, N2, N3, N4. The first transistors P1, P2, P3, P4 and N1, N2, N3, N4 may be arranged to provide a long path for slow slew input detection. Further, as shown, the first transistor devices may have first widths. In some cases, the first widths may be less than 1.5 microns in width. In some other cases, the first widths may be within a range of 0.2 microns to 1.2 microns in width. As generally known in the art, acceptable abbreviations for microns may be either u or p.

The first input stage 210 may be configured to receive a PAD input voltage, and then provide the received PAD input voltage to gates of transistors P1, P2, N1, N2. As shown, the transistors P1, P2, N1, N2 are disposed between and arranged for coupling to a first source voltage DVDD and a second source voltage DVSS, which may be referred to as a ground voltage GND. Further, the transistors P1, P2, N1, N2 are configured to provide the PADB input voltage to a first inverter 212, which is biased by the source voltages DVDD, DVSS. The first inverter 212 may be configured to provide an output voltage to a third stage or separation circuit 230.

In some implementations, each of the first transistors P1, P2, P3, P4 and N1, N2, N3, N4 may be sized with particular widths so as to reduce power dissipation in the first stage 210 during a first mode of operation, which may be referred to as a Schmitt mode of operation. For instance, transistor P1 may have a 0.8µ width, transistor P2 may have a 0.8µ width, transistor P3 may have a 0.65µ width, and transistor P4 may have a 0.4µ width. Further, transistor N1 may have a 1.0µ width, transistor N2 may have a 1.0µ width, transistor N3 may have a 0.4µ width, and transistor N4 may have a 0.4µ width.

In reference to FIG. 2, the GPIO receiver circuit 200 may include a second input stage 220 having second devices and a short path for fast slew input detection. The second input stage 220 may be separate from the first input stage 210. In some cases, the second input stage 220 may be referred to as a high frequency input detection stage that is configured to support high frequencies, such as, e.g., ~200 MHz. The second input stage 220 may be referred to as a CMOS detection stage for high frequency applications, such as, e.g., within a range of 25-300 MHz.

In some cases, the second devices may include second transistor devices, such as, e.g., one or more PMOS transistors MP, MP9, MP10 and one or more NMOS transistors MN, MN9, MN10. The first transistors MP, MP9, MP10 and MN, MN9, MN10 may be arranged to provide a short path for fast slew input detection. Further, the second devices may have second widths that are greater than the first widths of the first devices. For example, the second widths may be greater than 1.5 microns in width.

In some cases, the second input stage 220 may be configured to receive a PAD input voltage, and then provide the received PAD input voltage to gates of transistors MP10, MN10. As shown, the transistors MP9, MP10, MN9, MN10 are disposed between and arranged for coupling to the first source voltage DVDD and the second source voltage DVSS. Further, as shown the transistors MP9, MP10, MN9, MN10 may be configured to provide an output voltage to a second inverter 222, which is biased by the source voltages DVDD, DVSS. Further, the second inverter 222 is configured to provide an output voltage to a voltage down level shifter 224, which is biased by other source voltages VDD, VSS, and the voltage down level shifter 224 is configured to provide an output voltage Y of the GPIO receiver circuit 200.

Further, in reference to FIG. 2, the GPIO receiver circuit 200 may include the third stage 230, which may be referred to as a separation stage. In some cases, the third or separation stage 230 may be configured to couple the second input stage 220 to the first input stage 210 during the first mode of operation, which may be referred to as a Schmitt mode of operation. In some cases, the second input stage transistors MN and MP will be disabled during the Schmitt mode of operation. Further, the third or separation stage 230 may isolate the first input stage 210 from the second input stage 220 during a second mode of operation, which may be referred to as a CMOS mode of operation. In some cases, the second input stage 220 may be enabled during the second or CMOS mode of operation.

In some cases, the third stage or separation circuit 230 is configured to provide multiple control signals to the second stage 220. For instance, as shown, a first control signal P_CTRL may be provided to a gate of transistor MP9, and a second control signal N_CTRL may be provided to a gate of transistor MN9. Further, as shown in this instance, one or more first mode selection signals IS, ISB may be provided to gates of transistors MP, MN. When activated, the transistor MN may add the source voltage DVSS to the gate of transistor MP9. The transistor MP, when activated, may add the source voltage DVDD to the gate of transistor MN9.

As shown, the separation stage 230 may include one or more transmission gates or devices that are controlled by the one or more first mode selection signals IS, ISB. The transmission gates or devices may be implemented with one or more PMOS transistors P5, P6 and one or more NMOS transistors N5, N6. In some cases, the transistors P5, P6 and N5, N6 may be arranged to isolate the second input stage 220 from the first input stage 210 during the second or CMOS mode of operation. Further, in some cases, the one or more first mode selection signals IS, ISB may be referred to as one or more Schmitt mode selection signals, which may be implemented with a pair of complementary selection signals IS, ISB.

In some cases, the transistors P5, N5 of the third or separation stage 230 are arranged to receive the first mode selection signals IS, ISB, respectively, and provide the output signal received from the first stage 210 to the second stage 220 as the control signal P_CTRL. Further, as discussed herein, the control signal P_CTRL may be provided to the gate of the transistor MP9. In some cases, as shown, the transistors P6, N6 of the third or separation stage 230 are arranged to receive the first mode selection signals IS, ISB, respectively, and provide the output signal received from the first stage 210 to the second stage 220 as the control signal N_CTRL. Further, the control signal N_CTRL may be provided to the gate of the transistor MN9.

Various implementations described herein refer to and are directed to a Schmitt based GPIO receiver having a level detection circuit (e.g., Schmitt detection circuit 210) separated from the CMOS detection circuit 220 so as to substantially reduce the receiver's power dissipation for slow slew inputs at a PAD. Generally, the PAD may refer to a contact pad that may be used as a designated surface area of a printed circuit board (PCB) or die of an integrated circuit for soldering, wire-bonding, flip-chip mounting, etc. In reference to FIG. 2, one function of the GPIO receiver 200 may be to detect external PAD voltage at IO (input/output) supply levels and send the output to the core at core supply levels. In some cases, the GPIO receiver 200 may be configured to operate in CMOS mode so as to detect IO supply levels at a mid-point of the GPIO receiver 200, whereas the Schmitt mode introduces hysteresis along with high and low input detection levels. This hysteresis may assist with avoiding false IO output levels because of possible noise at the input PAD (when acting like a filter). In some cases, a CMOS based GPIO receiver may be designed to respond for fast slews to achieve better performance, such as e.g., tight duty cycle and propagation delays. However, in some cases, the Schmitt mode may be generally used in slow slew inputs to add hysteresis to the PAD input. In some cases, the GPIO receiver circuit 200 of FIG. 2 may be implemented with circuit stages for CMOS mode (fast slews) and Schmitt mode (slow slews or DC inputs) without the separation stage 230. However, in this instance, without use of the separation stage 230, unwanted power consumption may be created by the GPIO receiver 200 during slow slew input or when input is at Vih/Vil level or even input and receiver supply are upper and lower boundaries of IO supply (DVDD), respectively. Accordingly, as provided herein, the GPIO receiver circuit 200 of FIG. 2 may be implemented by separating the Schmitt mode (for slow slew) detection and the CMOS mode (for fast slew) detection, which may enable the GPIO receiver circuit to have reduced power consumption.

In some implementations, power consumption may be reduced in Schmitt mode by reducing the sizes of components in the Schmitt circuit; however, this may negatively impact performance in CMOS mode (fast slew), which is highly undesirable. As described herein, the GPIO receiver circuit 200 of FIG. 2 illustrates an improved design technique of implementing a Schmitt based receiver. For instance, the GPIO receiver circuit 200 of FIG. 2 implements a Schmitt detection circuit 210 (for slow slew detection) separated from the CMOS detection circuit 220 (for fast slew detection) using the third or separation control circuit 230. The separation control circuit 230 includes transmission gates that are controlled by Schmitt mode selection signals IS and ISB, where IS and ISB are complementary signals. Since Schmitt mode detection (slow slew) is separated from CMOS mode detection (fast slew), the sizes of the Schmitt detection circuit components may be reduced so as to thus reduce the power consumption during Schmitt mode (slow slew). Therefore, during Schmitt mode, IS=1 and ISB=0 turn ON the transmission gates of the separation control circuit 230 and pass the Schmitt circuit output to CMOS mode control inputs P_CTRL and N_CTRL, which may then turn ON the CMOS detection circuit, and send the data to output $\overline{Y}$ (not Y) of the GPIO receiver circuit 200.

As such, the CMOS detection circuit 220 may not disturb the Schmitt detection circuit 210, because transistors MN9 and MP9 may prevent or at least inhibit the signal to pass through that CMOS detection circuit 220 until the Schmitt detection circuit 210 has switched. During CMOS (fast slew) mode, IS=0 and ISB=1, which turns OFF transmission gates of the separation control circuit 230. This isolates the Schmitt detection circuit 210 from the CMOS detection circuit 220 and sets P_CTRL=0 through MN and N_CTRL=1 through MP, which enables the CMOS detection circuit 230 and sends the data to Y.

FIGS. 3-4 illustrate parts or portions of the GPIO receiver circuit 200 of FIG. 2 that operate in each of the Schmitt mode (i.e., first mode of operation) and CMOS mode (i.e., second mode of operation). For instance, FIG. 3 illustrates a part or portion 300 of the GPIO receiver circuit 200 that may be configured to operate in the CMOS mode of operation and that sends data from PAD to Y. FIG. 4 illustrates a part or portion 400 of the GPIO receiver circuit 200 of FIG. 2 that may be configured to operate in the Schmitt mode of operation and that sends data from PAD to Y.

Various implementations described herein may be used for many future GPIO libraries, where GPIO receiver circuitry may be designed to support both CMOS modes of operation (fast slew detection) and Schmitt modes of operation (slow slew detection), and where there is a relatively high demand for ultra-low power dissipation. Further, the various implementations described herein may be used in various IoT (Internet of Things) applications, such as, e.g., miniature sensor node applications.

Figure 5:
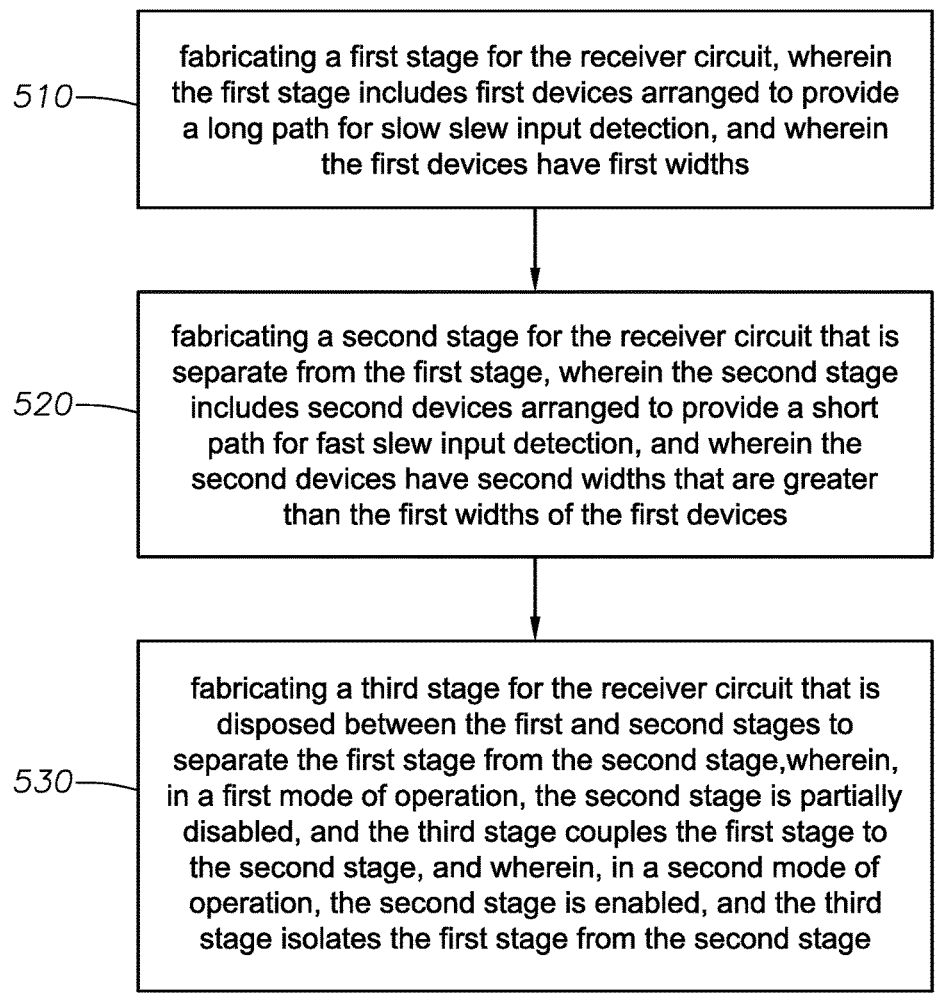
FIG. 5 illustrates a method for reducing power consumption of GPIO receiver circuitry in accordance with various implementations described herein.

FIG. 5 illustrates a method for reducing power consumption of GPIO receiver circuitry in accordance with various implementations described herein.

It should be understood that even though method 500 may indicate a particular order of execution of operations, in some instances, various certain portions of the operations may be executed in a different order, and on different systems. In some other instances, additional operations or steps may be added to and/or omitted from method 500. The method 500 may be implemented in hardware and/or software. If implemented in hardware, the method 500 may be implemented with various circuit components, such as described herein above in reference to FIGS. 2-4. If implemented in software, the method 500 may be implemented as a program or software instruction process that may be configured to provide GPIO receiver circuit functionality as described herein. Further, if implemented in software, instructions related to implementing the method 500 may be stored in memory and/or a database. For instance, a computer or various other computing devices having a processor and memory may be configured to perform method 500.

In reference to FIG. 5, method 500 may provide a receiver circuit, such as, e.g., a GPIO receiver circuit, having reduced power consumption. At block 510, method 500 may fabricate a first stage for the receiver circuit. The first stage may include first devices that are arranged to provide a long path for slow slew input detection. The first devices may have first widths.

At block 520, method 500 may fabricate a second stage for the receiver circuit that is separate from the first stage. The second stage may include second devices that are arranged to provide a short path for fast slew input detection. The second devices may have second widths that are greater than the first widths of the first devices.

At block 530, method 500 may fabricate a third stage for the receiver circuit that is disposed between the first and second stages so as to separate the first stage from the second stage. In a first mode of operation, the second stage may be partially disabled, and the third stage may couple the first stage to the second stage. In some cases, during the first mode of operation, the first stage may be electrically coupled to the second stage. Further, in a second mode of operation, the second stage may be enabled, and the third stage may isolate the first stage from the second stage. In some cases, during the second mode of operation, the first stage may be electrically isolated from the second stage.

Described herein are various implementations of a circuit. The circuit may include a first input stage having first devices and a first path for slow slew input detection. The first devices may have first widths. The circuit may include a second input stage having second devices and a second path for fast slew input detection. The second input stage may be separate from the first input stage. The second devices may have second widths that are greater than the first widths of the first devices. The circuit may include a separation stage that may couple the second input stage to the first input stage during a first mode of operation so as to reduce power consumption of the circuit during slow slew input detection.

Described herein are various implementations of a receiver. The receiver may include a Schmitt detection circuit having a first plurality of transistors arranged to provide a first path for slow slew input detection. Each of the first plurality of transistors may have first transistor widths. The receiver may include a CMOS detection circuit having a second plurality of transistors arranged to provide a second path for fast slew input detection. The CMOS detection circuit may be separate from the Schmitt detection circuit. Each of the second plurality of transistors may have second transistor widths that are greater than each of the first transistor widths of the first plurality of transistors. The receiver may include a separation circuit configured to disable the CMOS detection circuit during a Schmitt mode of operation and to isolate the CMOS detection circuit from the Schmitt detection circuit during the Schmitt mode of operation so as to reduce power consumption of the receiver during slow slew input detection.

Described herein are various implementations of a method for reducing power consumption of a receiver circuit. The method may include fabricating a first stage for the receiver circuit. The first stage may include first devices arranged to provide a first path for slow slew input detection. The first devices may have first widths. The method may include fabricating a second stage for the receiver circuit that is separate from the first stage. The second stage may include second devices arranged to provide a second path for fast slew input detection. The second devices may have second widths that are greater than the first widths of the first devices. The method may include fabricating a third stage for the receiver circuit that is disposed between the first and second stages to separate the first stage from the second stage. In a first mode of operation, the second stage may be partially disabled, and the third stage may couple the first stage to the second stage. In a second mode of operation, the second stage may be enabled, and the third stage may isolate the first stage from the second stage.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A circuit, comprising:
   a first input stage having first devices and a first path for slow slew input detection, wherein the first devices have first widths;
   a second input stage having second devices and a second path for fast slew input detection, wherein the second input stage is separate from the first input stage, and wherein the second devices have second widths that are greater than the first widths of the first devices; and
   a separation stage that couples the second input stage to the first input stage during a first mode of operation so as to reduce power consumption of the circuit during slow slew input detection,
   wherein the first input stage comprises a low frequency input detection stage that is configured to support low frequencies.

2. A circuit, comprising:
   a first input stage having first devices and a first path for slow slew input detection, wherein the first devices have first widths;
   a second input stage having second devices and a second path for fast slew input detection, wherein the second input stage is separate from the first input stage, and wherein the second devices have second widths that are greater than the first widths of the first devices; and
   a separation stage that couples the second input stage to the first input stage during a first mode of operation so as to reduce power consumption of the circuit during slow slew input detection,
   wherein the first input stage comprises a Schmitt detection stage for low frequency applications.

3. The circuit of claim 1, wherein the first devices comprise first transistor devices, and wherein the first widths are less than 1.5 microns in width.

4. The circuit of claim 1, wherein the first devices comprise first transistor devices, and wherein the first widths are within a range of 0.2 microns to 1.2 microns in width.

5. A circuit, comprising:
   a first input stage having first devices and a first path for slow slew input detection, wherein the first devices have first widths;
   a second input stage having second devices and a second path for fast slew input detection, wherein the second input stage is separate from the first input stage, and wherein the second devices have second widths that are greater than the first widths of the first devices; and a separation stage that couples the second input stage to the first input stage during a first mode of operation so as to reduce power consumption of the circuit during slow slew input detection, wherein the second input stage comprises a high frequency input detection stage that is configured to support high frequencies.

6. The circuit of claim 1, wherein the second input stage comprises a complementary metal-oxide-semiconductor (CMOS) detection stage for high frequency applications.

7. The circuit of claim 1, wherein the second devices comprise second transistor devices, and wherein the second widths are greater than 1.5 microns in width.

8. A circuit, comprising:
a first input stage having first devices and a first path for slow slew input detection, wherein the first devices have first widths;
a second input stage having second devices and a second path for fast slew input detection, wherein the second input stage is separate from the first input stage, and wherein the second devices have second widths that are greater than the first widths of the first devices; and
a separation stage that couples the second input stage to the first input stage during a first mode of operation so as to reduce power consumption of the circuit during slow slew input detection,
wherein the first mode of operation comprises a Schmitt mode of operation, and wherein the second input stage is partially disabled during the Schmitt mode of operation.

9. A circuit, comprising:
a first input stage having first devices and a first path for slow slew input detection, wherein the first devices have first widths;
a second input stage having second devices and a second path for fast slew input detection, wherein the second input stage is separate from the first input stage, and wherein the second devices have second widths that are greater than the first widths of the first devices; and
a separation stage that couples the second input stage to the first input stage during a first mode of operation so as to reduce power consumption of the circuit during slow slew input detection,
wherein the separation stage isolates the first input stage from the second input stage during a second mode of operation, and wherein the second input stage is enabled during the second mode of operation.

10. The circuit of claim 9, wherein the second mode of operation comprises a complementary metal-oxide-semiconductor (CMOS) mode of operation, and wherein the second input stage is enabled during the CMOS mode of operation.

11. The circuit of claim 1, wherein the separation stage comprises one or more transmission gates controlled by one or more first mode selection signals.

12. A circuit, comprising:
a first input stage having first devices and a first path for slow slew input detection, wherein the first devices have first widths;
a second input stage having second devices and a second path for fast slew input detection, wherein the second input stage is separate from the first input stage, and wherein the second devices have second widths that are greater than the first widths of the first devices; and a separation stage that couples the second input stage to the first input stage during a first mode of operation so as to reduce power consumption of the circuit during slow slew input detection,
wherein the separation stage comprises one or more transmission gates controlled by one or more first mode selection signals, and
wherein the one or more first mode selection signals comprise one or more Schmitt mode selection signals, and wherein the one or more Schmitt mode selection signals comprise a pair of complementary selection signals.

13. The circuit of claim 1, wherein the circuit comprises a general purpose input output (GPIO) receiver.

14. A receiver, comprising:
a Schmitt detection circuit having a first plurality of transistors arranged to provide a first path for slow slew input detection, wherein each of the first plurality of transistors has first transistor widths;
a complementary metal-oxide-semiconductor (CMOS) detection circuit having a second plurality of transistors arranged to provide a second path for fast slew input detection, wherein the CMOS detection circuit is separate from the Schmitt detection circuit, and wherein each of the second plurality of transistors has second transistor widths that are greater than each of the first transistor widths of the first plurality of transistors; and
a separation circuit configured to disable the CMOS detection circuit during a Schmitt mode of operation and to isolate the CMOS detection circuit from the Schmitt detection circuit during the Schmitt mode of operation so as to reduce power consumption of the receiver during slow slew input detection,
wherein the Schmitt detection circuit comprises a low frequency input detection circuit configured for low frequency applications, and wherein the CMOS detection circuit comprises a high frequency input detection circuit configured for high frequency applications.

15. The receiver of claim 14, wherein the first transistor widths of the first plurality of transistors are less than 1.5 microns in width, and wherein the second transistor widths of the second plurality of transistors are greater than 1.5 microns in width.

16. The receiver of claim 14, wherein the separation circuit isolates the Schmitt detection circuit from the CMOS detection circuit during a CMOS mode of operation, and wherein the CMOS detection circuit is enabled during the CMOS mode of operation.

17. The receiver of claim 14, wherein the receiver comprises a Schmitt based general purpose input output (GPIO) receiver.

18. A method for reducing power consumption of a receiver circuit, comprising:
fabricating a first stage for the receiver circuit, wherein the first stage includes first devices arranged to provide a first path for slow slew input detection, and wherein the first devices have first widths;
fabricating a second stage for the receiver circuit that is separate from the first stage, wherein the second stage includes second devices arranged to provide a second path for fast slew input detection, and wherein the second devices have second widths that are greater than the first widths of the first devices; and
fabricating a third stage for the receiver circuit that is disposed between the first and second stages to separate the first stage from the second stage, wherein, in a first mode of operation, the second stage is partially disabled, and the third stage couples the first stage to the second stage, wherein, in a second mode of operation, the second stage is enabled, and the third stage isolates the first stage from the second stage, and wherein the first input stage comprises a low frequency input detection stage that is configured to support low frequencies.

* * * * *